(12) United States Patent
Sundelin et al.

(10) Patent No.: US 6,967,336 B1
(45) Date of Patent: Nov. 22, 2005

(54) SYSTEM FOR PRECISE POSITION REGISTRATION

(75) Inventors: Ronald M. Sundelin, Yorktown, VA (US); Tong Wang, Newport News, VA (US)

(73) Assignee: Southeastern Universities Research Assn., Newport News, VA (US)

( * ) Notice: Subject to any disclaimer, the term of this patent is extended or adjusted under 35 U.S.C. 154(b) by 50 days.

(21) Appl. No.: 10/826,220

(22) Filed: Apr. 16, 2004

(51) Int. Cl.$^7$ .................. H01J 37/20; F16M 11/20; B23Q 1/03; B23Q 3/18

(52) U.S. Cl. ................... 250/442.11; 250/440.11; 108/156; 108/157.1; 248/188.3; 269/69; 269/305; 269/309

(58) Field of Search ............... 250/442.11, 440.11; 248/188.3, 176.1, 177.1; 269/309, 305, 69; 108/156, 157.1

(56) References Cited

U.S. PATENT DOCUMENTS 4,782,236 A * 11/1988 Chitayat ............... 250/440.11

* cited by examiner

Primary Examiner—Jack I. Berman

(57) ABSTRACT

An apparatus for enabling accurate retaining of a precise position, such as for reacquisition of a microscopic spot or feature having a size of 0.1 mm or less, on broad-area surfaces after non-in situ processing. The apparatus includes a sample and sample holder. The sample holder includes a base and three support posts. Two of the support posts interact with a cylindrical hole and a U-groove in the sample to establish location of one point on the sample and a line through the sample. Simultaneous contact of the third support post with the surface of the sample defines a plane through the sample. All points of the sample are therefore uniquely defined by the sample and sample holder. The position registration system of the current invention provides accuracy, as measured in x, y repeatability, of at least 140 μm.

8 Claims, 3 Drawing Sheets

SYSTEM FOR PRECISE POSITION REGISTRATION

The United States of America may have certain rights to this invention under Management and Operating contract No. DE-AC05-84ER 40150 from the Department of Energy.

FIELD OF THE INVENTION

The present invention relates to a system for retaining precise positions on a broad-area surface after non-in situ processing and more particularly to a system to improve position retaining on high resolution instruments which are located in inaccessible areas, such as in a vacuum chamber.

BACKGROUND OF THE INVENTION

It is often necessary to examine samples within environments that are difficult to access, such as within a vacuum chamber. Instruments such as electron microscopes and high-resolution optical microscopes are often used to examine the samples. After an interesting spot worthy of examination is located, it is often necessary to reacquire the spot at a later time. Precise position retaining is therefore required for relocation of a small interesting spot or feature after non-in situ processing of a sample. Current state of the art equipment for reacquiring microscopic positions is usually complex mechanically, and therefore difficult to maintain and prone to frequent maintenance. What is needed is a precise position registration system that is simple mechanically and that provides good accuracy in x, y repeatability.

SUMMARY OF THE INVENTION

The present invention describes an apparatus for enabling accurate retaining of a precise position, such as for reacquisition of a microscopic spot or feature having a size of 0.1 mm or less, on broad-area surfaces after non-in situ processing. The apparatus includes a sample and sample holder. The sample holder includes a base and three support posts. Two of the support posts interact with a cylindrical hole and a U-groove in the sample to establish location of one point on the sample and a line through the sample. Simultaneous contact of the third support post with the surface of the sample defines a plane through the sample. All points of the sample are therefore uniquely defined by the sample and sample holder. The position registration system of the current invention provides accuracy, as measured in x, y repeatability, of at least 140 $\mu$m.

REFERENCE NUMERALS USED IN THE SPECIFICATION AND DRAWINGS

10—system for precise position registration
12—sample
14—sample holder
16—sample body
18—top side of sample
20—bottom side of sample
22—cylindrical depression
24—U-groove depression
26—base of sample holder
28—first support post
30—second support post
32—first conical tip
34—second conical tip
36—third support post
38—hemispherical tip
40—side wall of cylindrical depression
42—inner surface of cylindrical depression
44—short side walls of U-groove depression
46—long side walls of U-groove depression
48—inner surface of U-groove depression
50—outer surface of first conical tip
52—outer surface of second conical tip
54—lower edge of side wall
58—point
60—lower edge of long side wall
62—line through sample
64—plane through sample
66—offset

DETAILED DESCRIPTION

Figure 1:
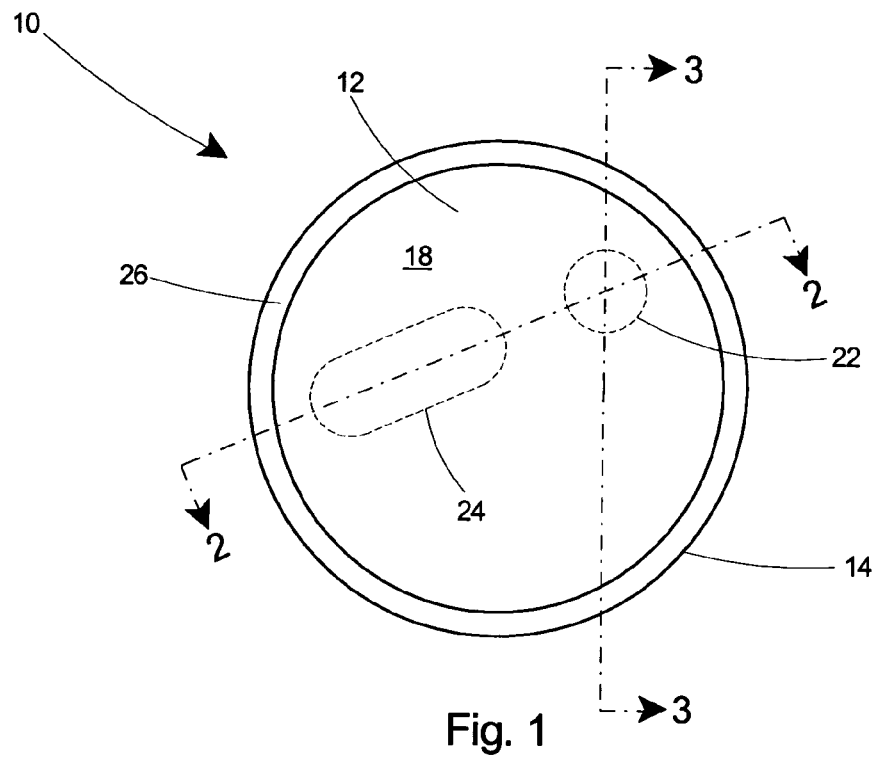
FIG. 1 is a top view of a system for precise position registration according to the present invention, including a sample and sample holder.

A top view is shown in FIG. 1 of a system for precise position registration 10 according to the present invention. The system includes a sample 12 and sample holder 14.

Figure 2:
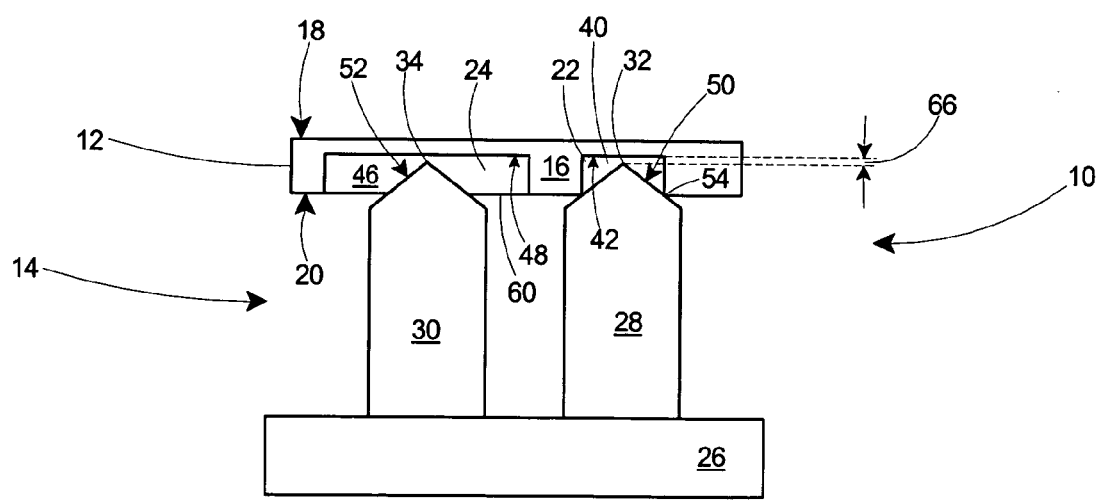
FIG. 2 is a sectional view of the sample and sample holder taken along line 2—2 of FIG. 1.

Referring to the cross-sectional view of FIG. 2, the sample 12 includes a body 16 having a top 18 and a bottom 20 side. The bottom side 20 of the sample 12 includes a cylindrical depression 22 and a U-groove depression 24. The sample holder 14 includes a base 26 having a first 28 and second 30 support post. The first support post 28 includes a first conical tip 32 and the second support post 30 includes a second conical tip 34.

Figure 3:
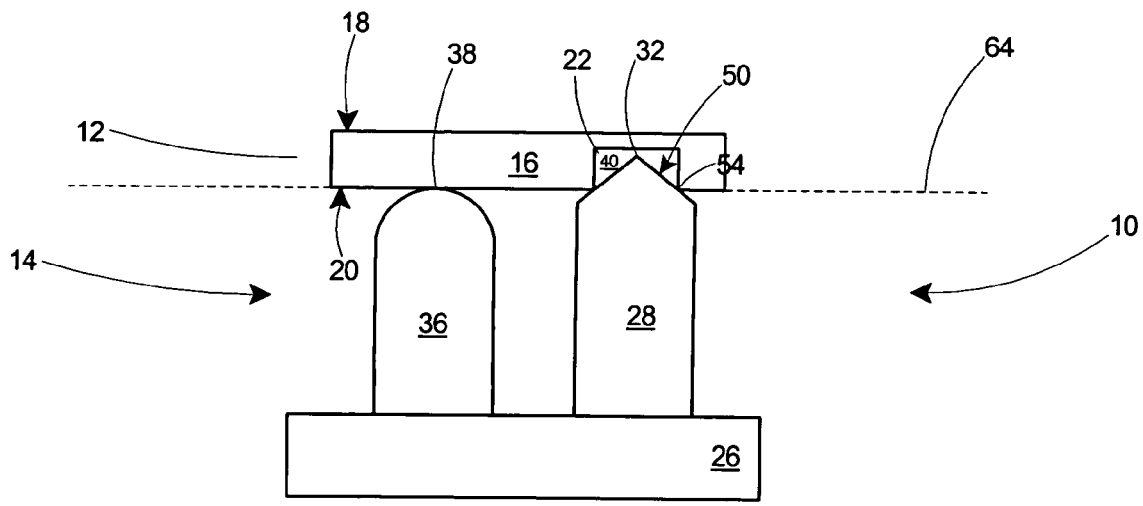
FIG. 3 is a sectional view of the sample and sample holder taken along line 3—3 of FIG. 1.

With reference to FIG. 3, the sample holder 14 also includes a third support post 36 having a hemispherical tip 38.

Figure 4:
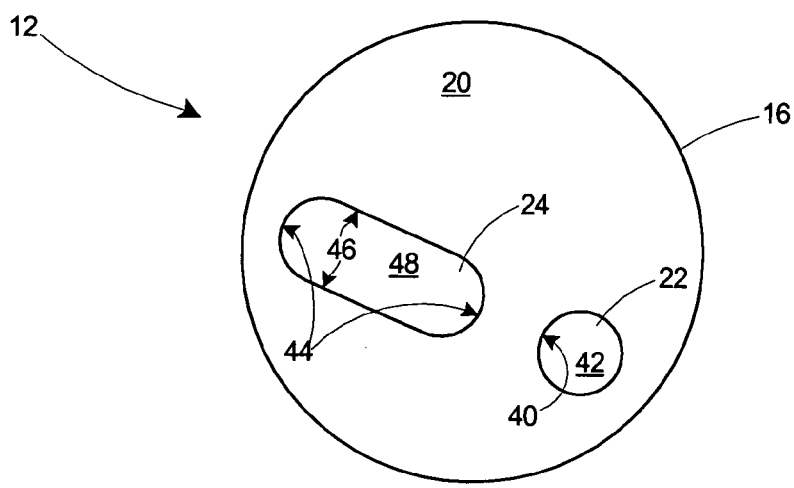
FIG. 4 is a bottom view of a sample in accordance with the present invention.

Referring now to FIG. 4, the bottom side 20 of the sample 12 includes the U-groove depression 24 and the cylindrical depression 22. Although the sample 12 is depicted as being round, it should be understood that the sample could be square, rectangular, polygonal, or virtually any shape. The cylindrical depression 22 includes a side wall 40 and an inner surface 42. The U-groove depression 24 includes short side walls 44 and long side walls 46 and an inner surface 48.

Figure 5:
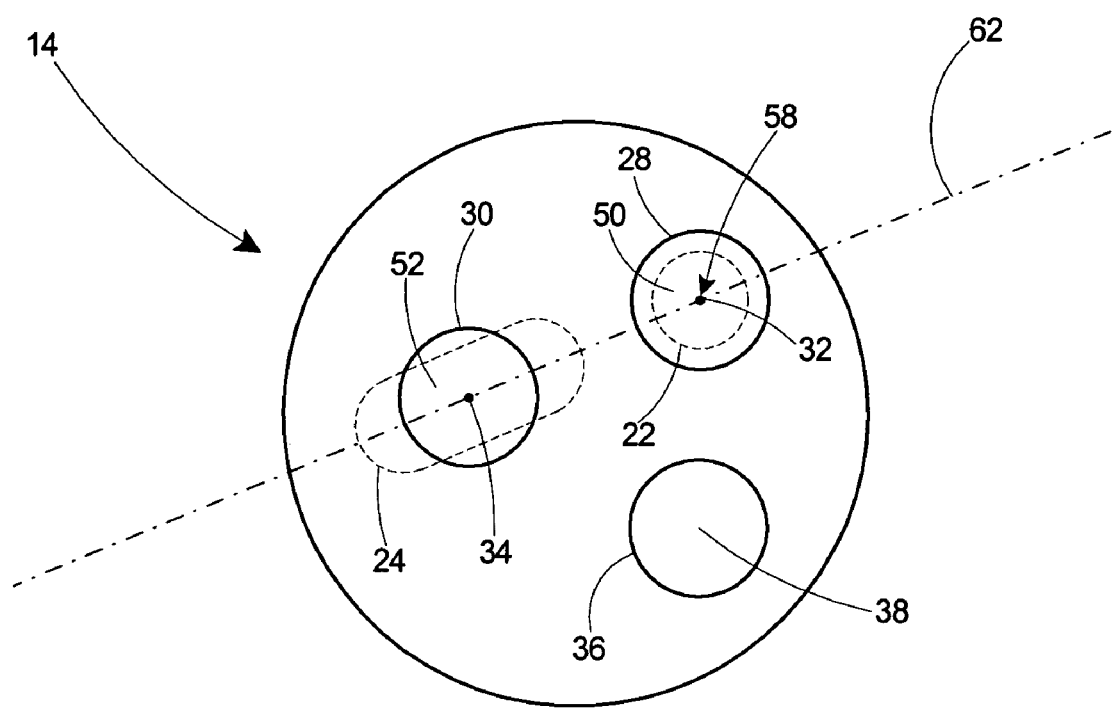
FIG. 5 is a top view of a sample holder in accordance with the present invention.

With reference to FIG. 5, the sample holder 14 includes three support posts including a first 28, second 30, and third 36 support post. The first 28 and second 30 support posts are depicted with first 32 and second 34 conical tips thereon, respectively. The third support post 36 includes the hemispherical tip 38, and therefore is depicted in FIG. 5 without a sharpened tip. Superimposed on the sample holder 14 of FIG. 5 in phantom lines are the relative locations of the cylindrical depression 22 and U-groove depression 24 of the sample (not shown), as they will rest after being placed on the sample holder 14. The relative locations of the cylindrical depression and U-groove depression will be explained herein in the description of the operation of the present invention.

As shown in FIGS. 2 and 5, the first 32 and second 34 conical tips include outer surfaces 50 and 52, respectively, as shown. The outer surfaces 50, 52 of the conical tips 32, 34 are sloped away from the conical tips 32, 34 in all directions.

For an understanding of the operation of the system for precise position registration according to the present invention, reference should be made to FIGS. 1–5. A sample holder 14 is provided having three support posts, including a first 28 and second 30 support post having conical tips 32, 34 respectively, as shown in FIGS. 2 and 5. The sample holder 14 is also provided with a third support post 36 having a hemispherical tip 38 as depicted in FIGS. 3 and 5. The purpose of the sample holder 14 is to establish a precise position registration system for the sample 12. The bottom side 20 of the sample 12 is provided with a cylindrical depression 22 and a U-groove depression 24. The sample holder 14 can then be placed within a vacuum chamber (not shown) or other closed inspection area. The sample holder 14 can be locked in place by clamps, two-sided tape, or similar fastening means (not shown). The sample 12 is then placed upon the sample holder 14 in such a manner that the first conical tip 32 of the first support post 28 enters the cylindrical depression 22, the second conical tip 34 of the second support post 30 enters the U-groove depression 24, and the hemispherical tip 38 of the third support post 36 contacts the bottom side 20 of the sample 12. The three support posts as shown in FIGS. 2 and 3 thus support the sample 12. The first conical tip 32 of the first support post 28 engages the side wall 40 of the cylindrical depression 22 at its lower edge 54, as shown in FIG. 2. Referring to FIG. 5, the contact of the first conical tip 32 with the first support post 28 therefore establishes the location of one point 58 on the sample 12. The second conical tip 34 of the second support post 30 engages the long side walls 46 of the U-groove depression 24 at their lower edges 60. The contact of the second conical tip 34 with the second support post 30 therefore establishes the location of a line 62 through the sample 12. The hemispherical tip 38 of the third support post 36 then engages the bottom side 20 of the sample 12 thereby defining a plane 64 through the sample, as shown in FIG. 3. By establishing the point 58 on the sample 12, the line 62 through the point 58, and the plane 64 through the sample 12, all points on the sample 12 are in locations uniquely defined by the sample 12 and sample holder 14. The sample 12 and sample holder 14 thereby create an economical system for precise position registration that is advantageous for sequential processing or examination steps, such as manufacturing a component or treating a component.

With reference to FIG. 2, it should be noted that the sample 12 rests on the sample holder 14 at edges 54 and 60, which bear against the outer surfaces 50 and 52 of the conical tips 32 and 34, respectively. As shown in FIG. 2, there is an offset 66 between the conical tips 32, 34 and the respective inner surfaces 42, 48 of the cylindrical depression 22 and the U-groove depression 24. This offset 66 ensures that one side of the sample 12 is balanced on the outer surfaces 50, 52 of the conical tips and not on the conical tips 32, 34 themselves.

There are many manufacturing procedures in which several processes are performed in succession on one spot. A typical example would be in the processing of integrated circuits or other sensitive electronic components. During these operations the work piece typically must be held in a vacuum to prevent contamination. The sample and sample holder of the present invention can therefore be used to provide a rapid means of precisely aligning the work piece.

An additional advantage of the system for precise position registration is that critical tolerances are not necessary for the machining of the sample and sample holder. Highly precise locations of the support posts 28, 30, and 36, the cylindrical depression 22, and the U-groove depression 24 are not required to make the location of a particular sample holder uniquely defined.

The sample 12 and sample holder 14 are preferably constructed of a hard material such as rigid plastic or a metal. The only requirement to achieve good alignment between the sample 12 and sample holder 14 is that the contact surfaces, such as the first 32 and second 34 conical tips, the hemispherical tip 38, the lower edge 54 of the side wall 40 of the cylindrical depression 22, and the lower edge 60 of the long side walls 46 of the U-groove depression 24 be smooth so that the sample 12 can fully seat on the support posts 28, 30, 36 without being impeded by surface roughness. Also, the materials of the sample 12 and sample holder 14 must be such that the coefficient of friction between them does not prevent the sample 12 from fully seating on the sample holder 14.

One obvious advantage of the precise position registration system is its mechanical simplicity. The absence of tight machining tolerances enables the system to be economically produced.

The sample and sample holder can be produced in a variety of sizes depending on the particular application. The sample holder can therefore be produced for relatively small samples, with the support posts located a few millimeters apart, or for relatively large samples in which the support posts may be located several feet across.

As the invention has been described, it will be apparent to those skilled in the art that the same may be varied in many ways without departing from the spirit and scope of the invention. Any and all such modifications are intended to be included within the scope of the appended claims.

What is claimed is:

1. A system for precise position registration comprising:
   a. a sample holder including
      i. a base; and
      ii. three support posts;
   b. a sample including:
      i. a body having a top and a bottom side;
      ii. a cylindrical depression in said bottom side of said body; and
      iii. a U-groove depression in said bottom side of said body.

2. The position registration system of claim 1 wherein said support posts include:
   a. a first support post having a first conical tip;
   b. a second support post having a second conical tip; and
   c. a third support post having a hemispherical tip.

3. The position registration system of claim 2 wherein
   a. said cylindrical depression includes a side wall and an inner surface within said body; and
   b. said U-groove depression includes short and long side walls and an inner surface.

4. The position registration system of claim 3 wherein
   a. said first conical tip of said first support post includes an outer surface; and
   b. said second conical tip of said second support post includes an outer surface.

5. The position registration system of claim 4 wherein said sample holder is located under said sample and:

a. said first conical tip of said first support post engages said side wall of said cylindrical depression in such a manner that said first conical tip is offset from said inner surface of said cylindrical depression;
b. said second conical tip of said second support post engages said short side walls of said U-groove depression in such a manner that said second conical tip is offset from said inner surface of said U-groove depression; and
c. said hemispherical tip of said third support post engages said bottom side of said body.

6. The position registration system of claim 5 wherein said support posts are cylindrical in shape.

7. The position registration system of claim 3 wherein said outer surfaces of said first and second conical tips, said side wall of said cylindrical depression, and said short side walls of said U-groove depression have smooth walls.

8. The position registration system of claim 1 which includes an accuracy, as measured in x, y repeatability, of at least 140 µm.

* * * * *